US007295640B2

(12) United States Patent
Minzoni et al.

(10) Patent No.: US 7,295,640 B2
(45) Date of Patent: Nov. 13, 2007

(54) PHASE DETECTOR

(75) Inventors: Alessandro Minzoni, München (DE); Stephen Mann, Haar (DE)

(73) Assignee: Infineon Technologies AG, Munich (DE)

( * ) Notice: Subject to any disclaimer, the term of this patent is extended or adjusted under 35 U.S.C. 154(b) by 764 days.

(21) Appl. No.: 10/640,230

(22) Filed: Aug. 13, 2003

(65) Prior Publication Data
US 2004/0032285 A1    Feb. 19, 2004

(30) Foreign Application Priority Data
Aug. 13, 2002    (DE) ................................ 102 37 120

(51) Int. Cl.
*H04L 7/00* (2006.01)
*G01N 30/86* (2006.01)

(52) U.S. Cl. .......................................... 375/371; 327/1
(58) Field of Classification Search ........ 375/371–376; 327/1–12, 13–99
See application file for complete search history.

(56) References Cited

U.S. PATENT DOCUMENTS

| | | | | |
|---|---|---|---|---|
| 3,610,954 A | * | 10/1971 | Treadway | ..................... 327/12 |
| 3,646,455 A | * | 2/1972 | Coccagna | ..................... 327/12 |
| 3,710,140 A | * | 1/1973 | Volmerange | ................. 327/12 |
| 4,322,643 A | | 3/1982 | Preslar | |
| 4,500,852 A | * | 2/1985 | Phillips | ........................ 331/12 |
| 4,739,278 A | * | 4/1988 | Des Brisay et al. | ............. 327/7 |
| 4,751,469 A | * | 6/1988 | Nakagawa et al. | ............. 327/7 |
| 4,928,026 A | * | 5/1990 | Ebesyu | ........................ 327/12 |
| 5,095,287 A | * | 3/1992 | Irwin et al. | ................. 331/1 A |
| 5,440,274 A | | 8/1995 | Bayer | |
| 5,583,458 A | * | 12/1996 | Bazes | ............................ 327/3 |
| 5,825,210 A | * | 10/1998 | Oh | ............................... 327/12 |

FOREIGN PATENT DOCUMENTS

DE    31 16 603 C2    2/1982
DE    41 39 117 C1    6/1993

* cited by examiner

*Primary Examiner*—Chieh M. Fan
*Assistant Examiner*—Jason M. Perilla
(74) *Attorney, Agent, or Firm*—Laurence A. Greenberg; Werner H. Stemer; Ralph E. Locher

(57) ABSTRACT

A phase detector has a reference signal input for a reference signal and a detector input for a signal to be evaluated. A memory unit is connected to the detector input and stores a state of the signal to be evaluated at a storage instant. An evaluation unit is connected downstream of the storage unit and is designed in such a way that it can be used to compare the stored state of the signal with the state of the reference signal at an evaluation instant and to generate an evaluation result signal therefrom. The phase detector has a control unit for prescribing the storage instant and the evaluation instant, the control unit prescribing the storage instant first and then the evaluation instant. A detector output is connected to the evaluation unit and the evaluation result signal can be tapped off at the detector output.

10 Claims, 14 Drawing Sheets

PHASE DETECTOR

BACKGROUND OF THE INVENTION

FIELD OF THE INVENTION

The invention lies in the signal processing field and pertains, more specifically, to a phase detector for determining the phase angle between a reference signal and a further signal.

Phase detectors are used in order to be able to determine the phase relationship between two signals. The phase detector compares the temporal position of a reference signal, designated by CLKref in FIG. 1, with the temporal position of a further signal, designated by CLKdel in the same figure. The offset between the two signals is the phase difference or phase shift. If the signal CLKdel leads the reference signal CLKref, that is to say the phase difference $\Delta\phi$ is negative, see FIG. 1 on the left, then a negative phase difference results. Accordingly, the phase detector supplies INCR as control signal. If the signal CLKdel lags behind the reference signal CLKref, that is to say the phase difference $\Delta\phi$ is positive, see FIG. 1 on the right, then a positive phase difference results. The phase detector accordingly supplies DECR as control signal at the output.

Knowledge of the phase angle or phase relationship of two signals is necessary for example in the case of a digital loop control synchronization—also referred to as DLL or delay locked loop—in order to synchronize the reference signal with the further signal. In order that the DLL can operate without any errors, it must be possible to correctly determine the phase relationship between the two signals for all phase relationships that possibly occur. Otherwise the result may be an incorrect synchronization and thus consequential errors in the components connected downstream. If the DLL gives rise to an incorrect synchronization for example during the synchronization of the internal clock of an integrated memory module with an external reference clock, this can lead to an error when reading the data stored in the memory module.

The phase detector as shown in FIG. 2 has hitherto operated in a plurality of stages, which are described below. For reasons connected with the signal propagation time, it is helpful to configure the layout symmetrically with respect to the line of symmetry Sym, shown as a dash-dotted line in the figure.

In a first stage, the delay is effected on the basis of a delay unit 1. To that end, a plurality of inverters 2 are connected in series. The number of inverters 2 prescribes the delay duration. From the reference signal or reference clock CLK, an early reference clock START or reset delayed by the time duration $\delta a$ is obtained at the output of the first inverter 2 and a late reference clock STOP or IA is obtained at the output of the fourth serial inverter 2, the reference clock being delayed by the time duration $\delta b$. The further signal, also referred to as feedback signal FB hereinafter, is likewise delayed by means of a plurality of inverters 2 and made available to an evaluation unit 3 as a delayed feedback signal IB delayed by the time duration $\delta b$.

The second stage, the evaluation of the phase relationship of the two signals reference clock CLK and feedback FB, begins with the rising edge of the reference clock signal CLK. The rising edge of the early reference clock START is used to start the evaluation. The rising edge of the late reference clock signal STOP, by contrast, is used to end the evaluation of the phase relationship. During this time interval between START and STOP, the evaluation unit 3 determines the phase angle of the two signals reference clock CLK and feedback FB. As soon as the rising edge of the late reference clock STOP is present at the input of the evaluation unit 3, changes to the feedback signal FB are no longer allowed.

The third stage, storage in the latch LCH, begins with the rising edge of the late reference signal STOP.

However, if a change in the state of the delayed feedback signal IB nevertheless occurs during the third stage, as is shown in FIG. 3, so that the falling edge of the delayed feedback signal IB occurs in the time period between the rising edge of the early reference signal START and the rising edge of the late reference clock STOP, then the delayed feedback signal IB assumes two different states during this time, which means an undefined state for the storage of the state of the delayed feedback signal IB and thus indirectly also of the feedback signal FB.

The way in which such an undefined state arises is explained below with reference to FIGS. 4A to 4D.

In the first phase Ph1, the feedback signal FB is at the high level. Both the early reference signal START and the late reference signal STOP are at the low level. The corresponding signal states are shown in FIG. 4A. The circuit section of the phase detector from FIG. 2 which serves for ascertaining the state of the feedback signal FB is shown for the first phase in FIG. 4B. The two p-channel transistors P1 and P4 are open, that is to say nonconducting or turned off. The two n-channel transistors N1 and N2 are closed, that is to say conducting, whereas the n-channel transistor N3, which is driven by the late reference signal STOP, is open and the n-channel transistor N4, which is driven by the feedback signal FB, is closed. The two transistors N3 and N4 are at the potential Vint by way of the output-side terminal via which they are connected to one another. The decrementing output DEC and the incrementing output INC of the circuit are likewise at the potential Vint.

During the second phase Ph2, the early reference signal START changes from low to high, while the feedback signal FB changes from high to low; in this respect, see FIG. 4A. The states of the transistors and the potentials of the abovementioned circuit section of the phase detector from FIG. 2 are shown for the second phase in FIG. 4C. While the states of the transistors P4, N1, N4 and N3 remain unchanged, the transistor N2 is opened and the transistor P1 is closed. The common potential of the transistors N3 and N4 changes to GND because the early reference signal START closes the n-channel transistor N5 in the high state. The incrementing output INC remains at Vint. The decrementing output DEC, by contrast, changes to low.

During the third phase Ph3, the late reference signal STOP also changes from low to high. The feedback signal FB remains in the low state; in this respect, see FIG. 4A again. The states of the transistors and the potentials of the abovementioned circuit section of the phase detector from FIG. 2 are shown for the third phase in FIG. 4D. The transistors N2 and N4 are now open, the transistors N1 and N3 are closed, the transistor P4 changes to the closed state and the transistor P1 changes to the open state. The consequence of the two open transistors P1 and N2 is that the path via the transistors P1, N2 and N3 acquires high impedance, which in turn results in an undefined state for the decrementing output DEC. The incrementing output INC of the phase detector changes to low.

It can be seen that the states at the incrementing output INC and at the decrementing output DEC thus change during the storage phase. At this point in time, the nodes of the circuit are not completely discharged or charged, which generates an undefined situation for the input of the memory. The consequence is an unstable pulse generation dependent on the high-impedance circuit path, the resultant signal profiles being shown in FIG. 5. In the two diagrams of FIG. 5, time is plotted on the x axis and the signal amplitude is plotted on the y axis. The upper diagram shows the profile of the signals STOP and FB, while the lower diagram shows the profile of the signals INC and DEC. The unstable pulse generation can result in the above-mentioned malfunctions if this circuit is used in a DLL.

The same applies to the signal profile of the delayed reference signal STOP and of the delayed feedback signal IB as shown in FIG. 6. Here, time is plotted on the x axis and the amplitude is plotted on the y axis. The states of the incrementing signal IQ and of the decrementing signal IQN in the phase detector become unstable and thus so do the states of the output signals Q and QN of the phase detector. After the signal START and the delayed feedback signal IB have changed state, the amplitude of the signal IQN decreases only slowly until reaching the potential GND on account of the high-impedance path described in FIG. 4D. The two signals IQ and IQN then change their state after approximately 139.4 ns and the two signals Q and QN at the outputs of the phase detector circuit change their state after approximately 139.6 ns.

FIG. 7 shows, in the upper region, a timing diagram with signal profiles of the undelayed and delayed feedback signal IB and FB, respectively, and, in the lower region, the signal profiles of the undelayed, slightly delayed and longer delayed reference signal CLK, DRESET and IA, respectively, of the phase detector. It can be seen in this case that the delayed feedback signal IB changes its state from high to low precisely in the time period which lies between the level change of the early reference signal DRESET and of the late reference signal IA. This leads to the problems described in the introduction.

SUMMARY OF THE INVENTION

It is accordingly an object of the invention to provide a phase detector, which overcomes the above-mentioned disadvantages of the heretofore-known devices and methods of this general type and in which a state change in the signal to be compared during the evaluation of the phase angle has no influence on the evaluation and the phase detector generates a stable output signal at any time. The intention is thus to prevent an erroneous determination of the phase angle from occurring.

With the foregoing and other objects in view there is provided, in accordance with the invention, a phase detector, comprising:

a reference signal input for receiving a reference signal and a detector input for receiving a signal to be evaluated;

a memory unit connected to the detector input for storing a state of the signal to be evaluated at a given storage instant;

an evaluation unit connected downstream of the memory unit, in a signal flow direction, and adapted to compare the stored state of the signal to be evaluated with a state of the reference signal at an evaluation instant and to generate an evaluation result signal therefrom;

a control unit for prescribing the storage instant and the evaluation instant, the control unit being connected to the memory unit and to the evaluation unit and configured to first prescribe the storage instant and subsequently prescribe the evaluation instant; and a detector output connected to the evaluation unit and carrying the evaluation result signal.

In other words, the novel phase detector has a reference signal input for applying a reference signal and a detector input for applying a signal to be evaluated. Moreover, provision is made of a memory unit (also referred to as a storage unit) connected to the detector input and serving for storing the state of the signal to be evaluated at a storage instant. Furthermore, there is an evaluation unit present, which is connected downstream of the storage unit and is designed in such a way that it can be used to compare the stored state of the signal with the state of the reference signal at an evaluation instant and to generate an evaluation result signal therefrom. The phase detector additionally has a control unit for prescribing the storage instant and the evaluation instant, the control unit being connected to the storage unit and the evaluation unit and prescribing the storage instant first and then the evaluation instant. Finally, there is also a detector output present, which is connected to the evaluation unit and at which the evaluation result signal can be tapped off.

In accordance with an added feature of the invention, the memory unit has a first memory device and a second memory device. The first memory device has a first input for applying the signal to be evaluated and the second memory device has a first input for applying an inverted signal to be evaluated. Moreover, the first and second memories each have a second input for applying a signal for prescribing the storage instant.

In one development of the invention, the memories each have a flip-flop.

In a further embodiment of the invention, the memory devices each have two NAND gates whose outputs are fed back to the inputs of the respective other NAND gate.

The memory unit advantageously stores the state of the signal to be evaluated upon the occurrence of a rising edge of the reference signal.

The evaluation unit may have a clock-state-controlled RS flip-flop.

It is advantageous if, in the phase detector according to the invention, the first and second inputs of the clock-state-controlled RS flip-flop are connected to the outputs of the two memory devices.

In an additional embodiment, a further flip-flop is connected downstream of the clock-state-controlled RS flip-flop.

Moreover, in the phase detector according to the invention, a delayed reference signal may be present at the input for the clock state control of the clock-state-controlled RS flip-flop.

In one development of the invention, a further flip-flop is provided, which is connected, on the input side, to the outputs of the storage unit and suppresses an offset.

Finally, inverters may be provided by means of which the signal delay is effected.

Other features which are considered as characteristic for the invention are set forth in the appended claims.

Although the invention is illustrated and described herein as embodied in a phase detector, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 16 is a fifth timing diagram of the phase detector according to the invention.

DESCRIPTION OF THE PREFERRED EMBODIMENTS

Figure 10:
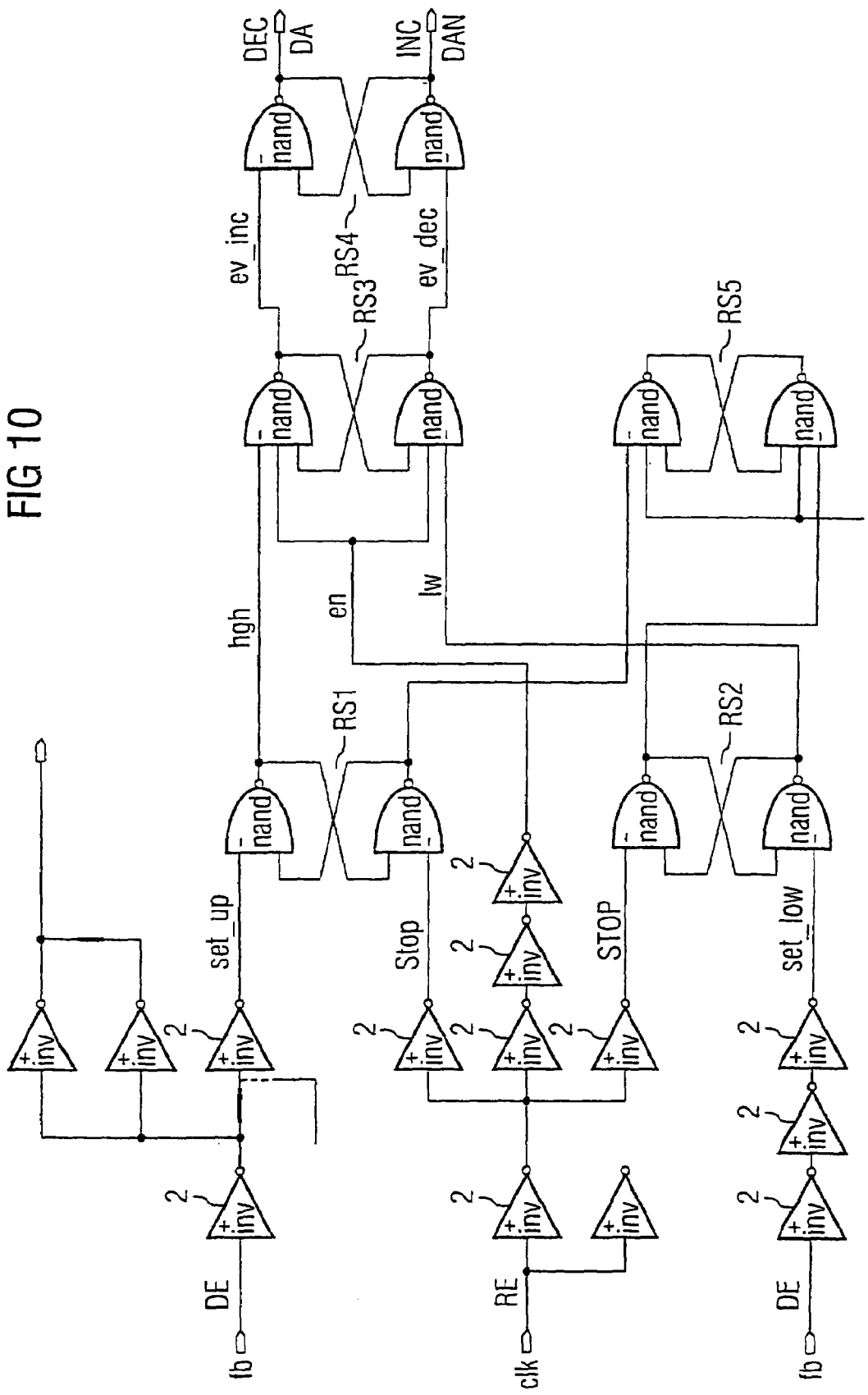
FIG. 10 is a circuit diagram of the basic construction of a first embodiment of the phase detector according to the invention.

Referring now once more to the figures of the drawing in detail, and particularly to FIG. 10 thereof, there is shown an exemplary embodiment of the phase detector according to the invention in which firstly the state of the feedback signal fb is stored and then the evaluation is effected. To that end, the state of the feedback signal fb is followed until a rising edge of the reference signal clk occurs. As soon as this is the case, the state of the feedback signal fb is stored. This ensures that a change to the feedback signal fb no longer has any effect during the evaluation of the signals because the stored state of the feedback signal fb is evaluated. FIG. 10 thus illustrates a possible first basic embodiment of the circuit for the phase detector according to the invention.

Figure 11:
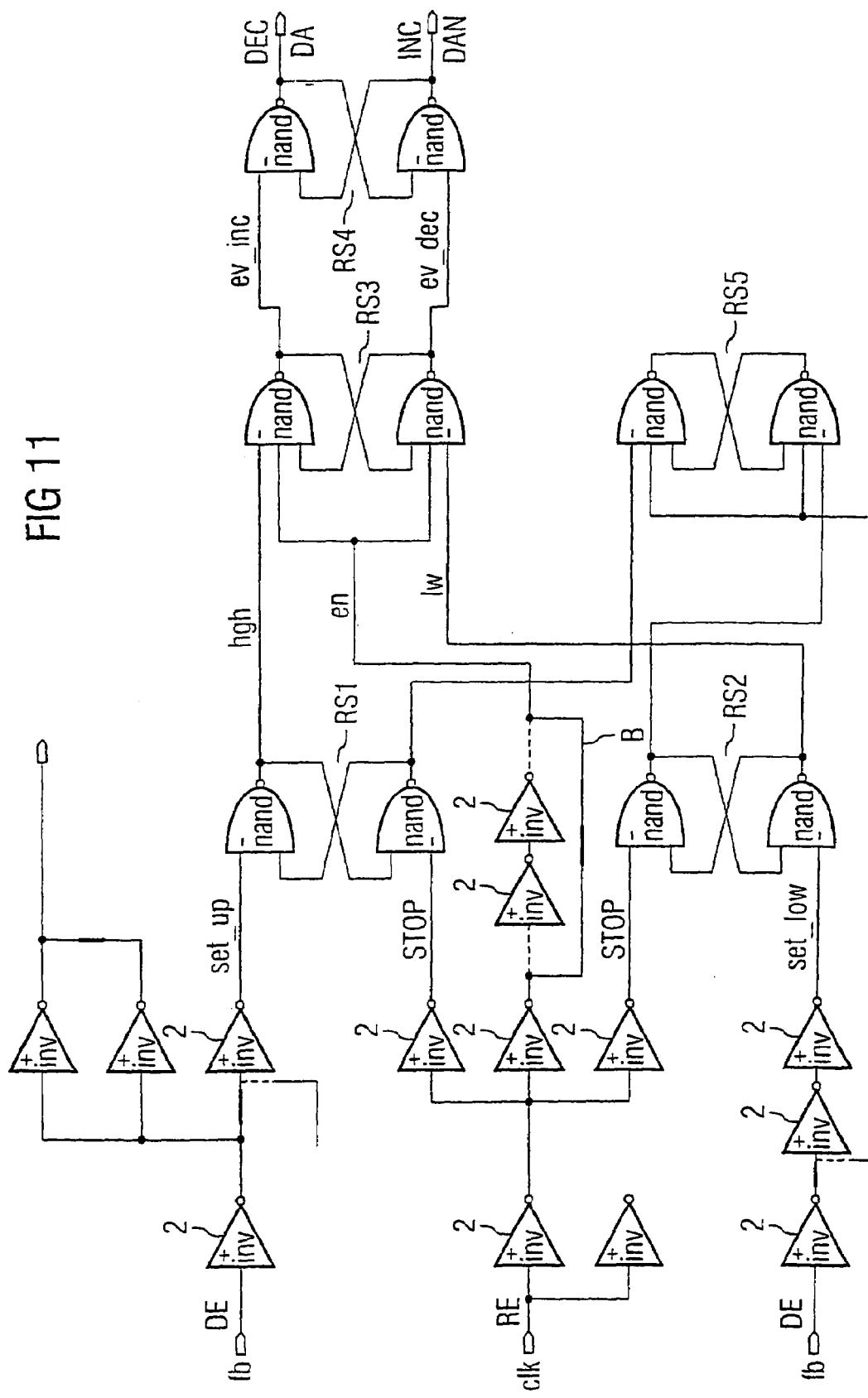
FIG. 11 is a circuit diagram of the basic construction of a second embodiment of the phase detector according to the invention.

FIG. 11 shows a possible second basic embodiment of the circuit for the phase detector according to the invention. The embodiment in accordance with FIG. 11 differs from that in accordance with FIG. 10 by the design in the region of the third and fourth inverters 2 in the signal path of the reference signal clk. This is intended to express the fact that the number of inverters is to be adapted to the technical boundary conditions. If appropriate, some inverters are to be omitted or bridged.

Both the embodiment of the phase detector in accordance with FIG. 10 and that in accordance with FIG. 11 have a plurality of RS flip-flops as memory devices, or memories, the construction and method of operation of which are explained with reference to FIGS. 8 and 9.

Figure 1:
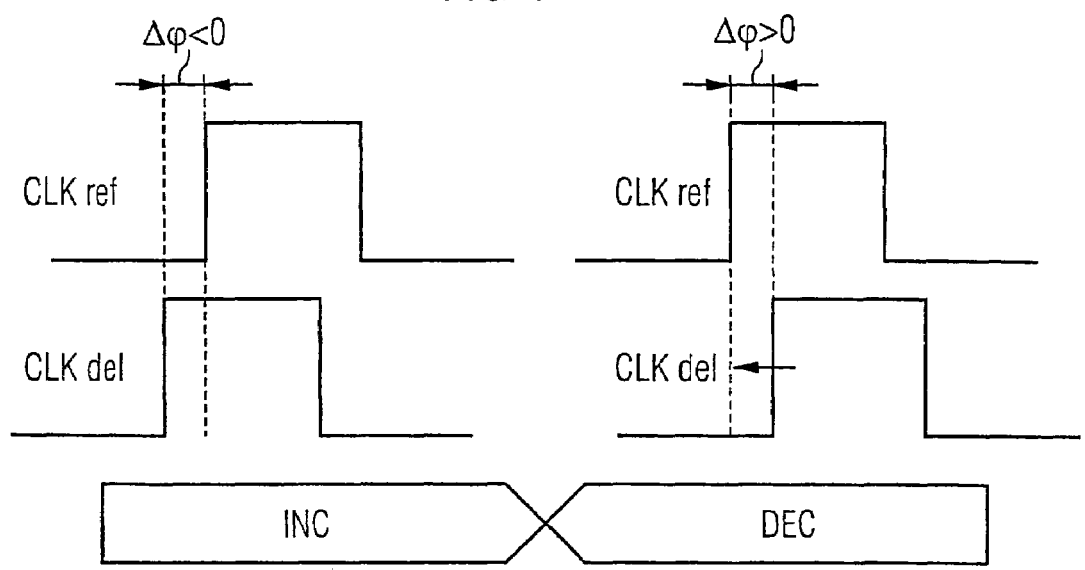
FIG. 1 is a timing diagram for illustrating a phase shift.
Figure 2:
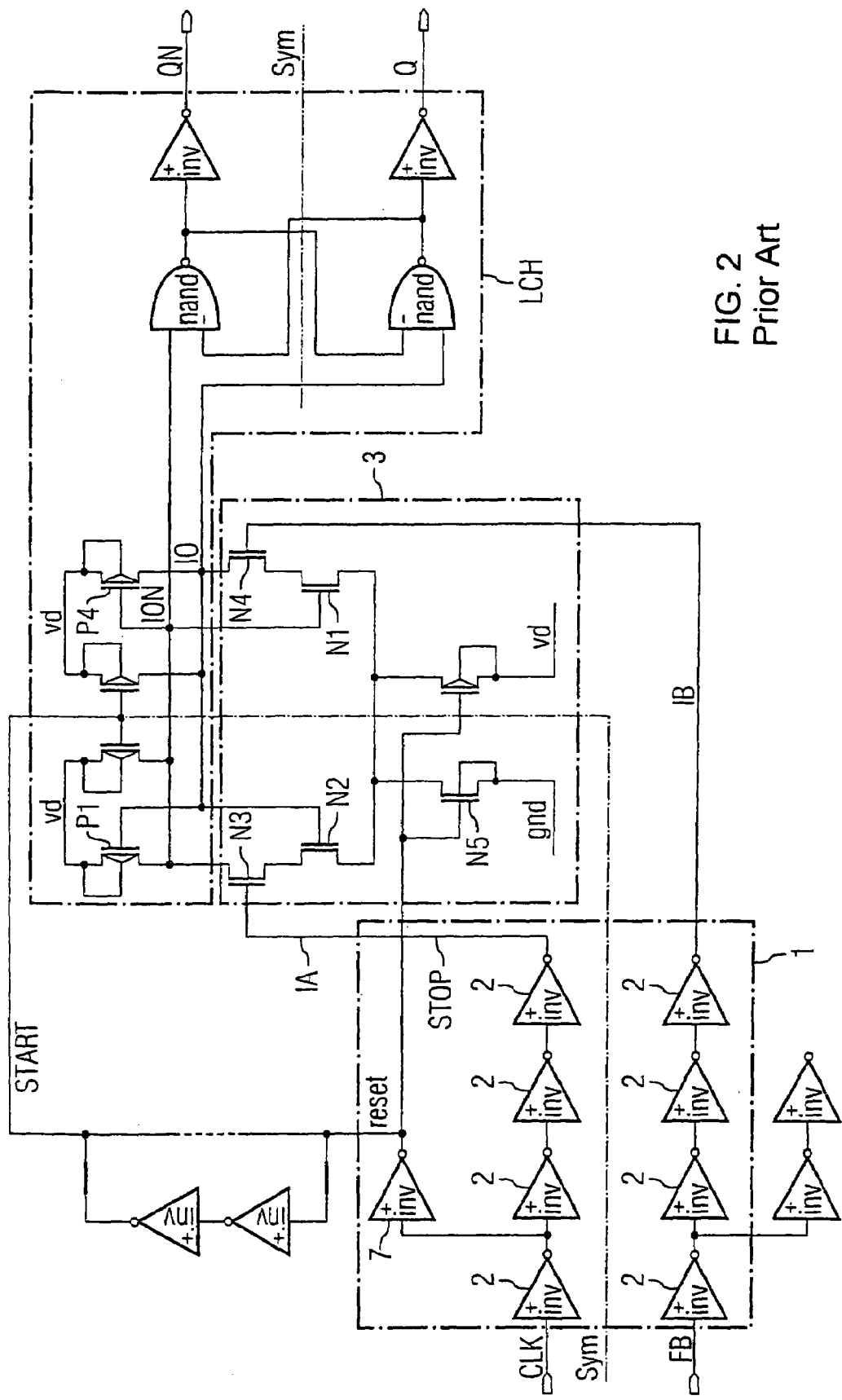
FIG. 2 is a diagram of the basic construction of a prior art phase detector.
Figure 3:
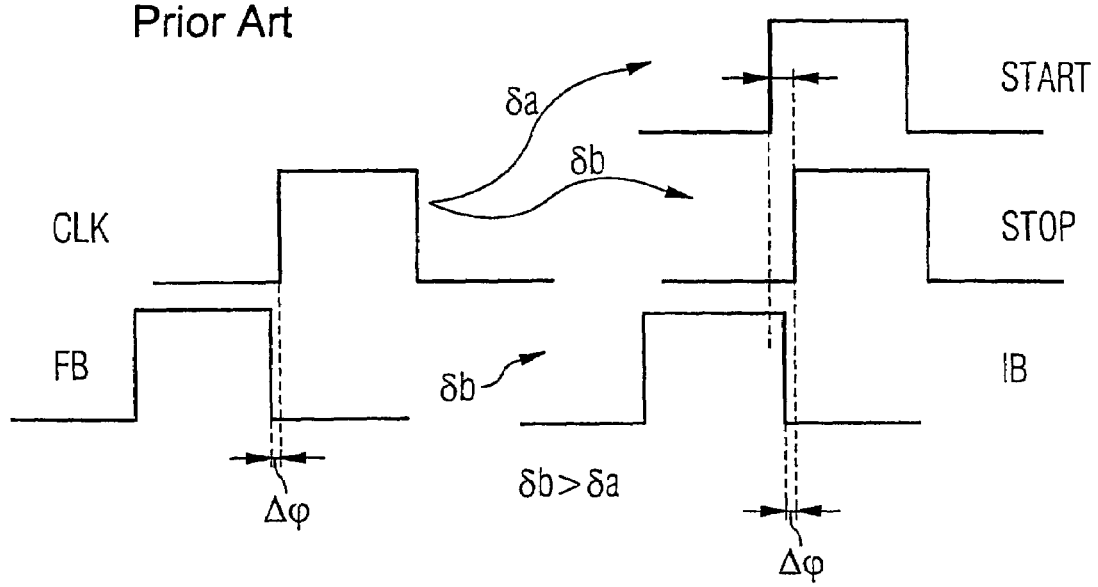
FIG. 3 is a timing diagram with the signals which occur in the phase detector in accordance with the prior art.
Figure 4A:
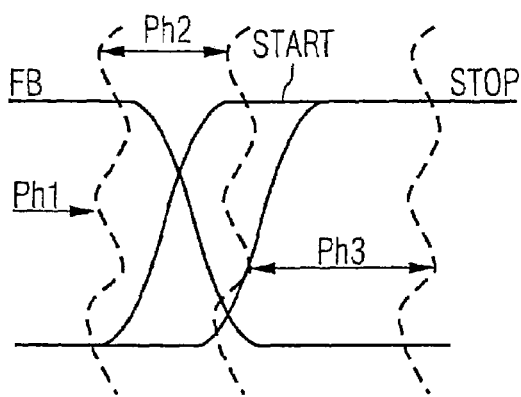
FIG. 4A is the profile of the reference and feedback signals divided into three regions.
Figure 4B:
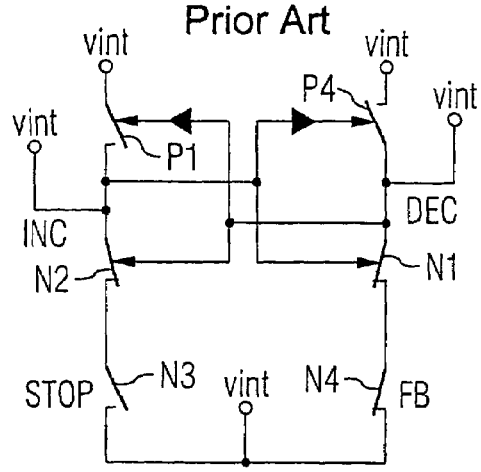
FIG. 4B is the circuit state of a section of the phase detector as is applicable to the signal state occurring in the first region.
Figure 4C:
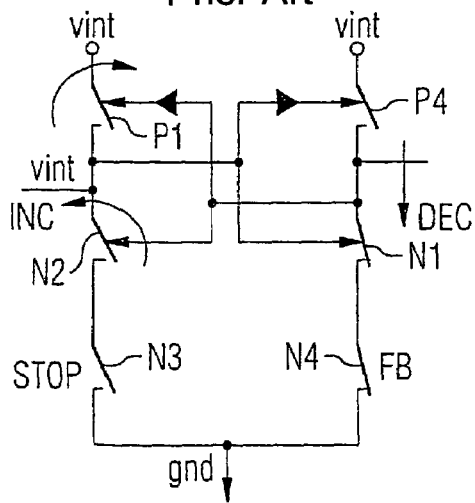
FIG. 4C is the circuit state of a section of the phase detector as is applicable to the signal state occurring in the second region.
Figure 4D:
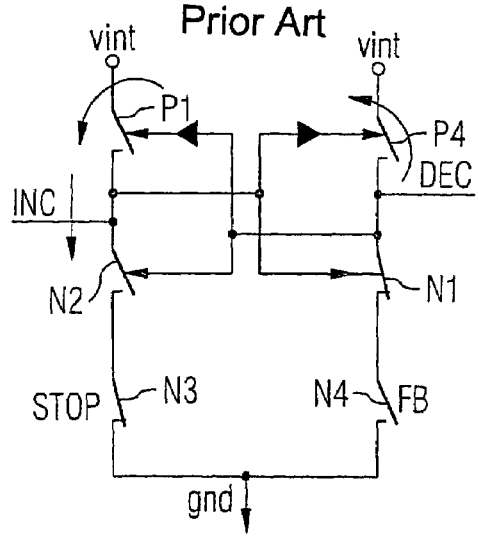
FIG. 4D is the circuit state of a section of the phase detector as is applicable to the signal state occurring in the third region.
Figure 5:
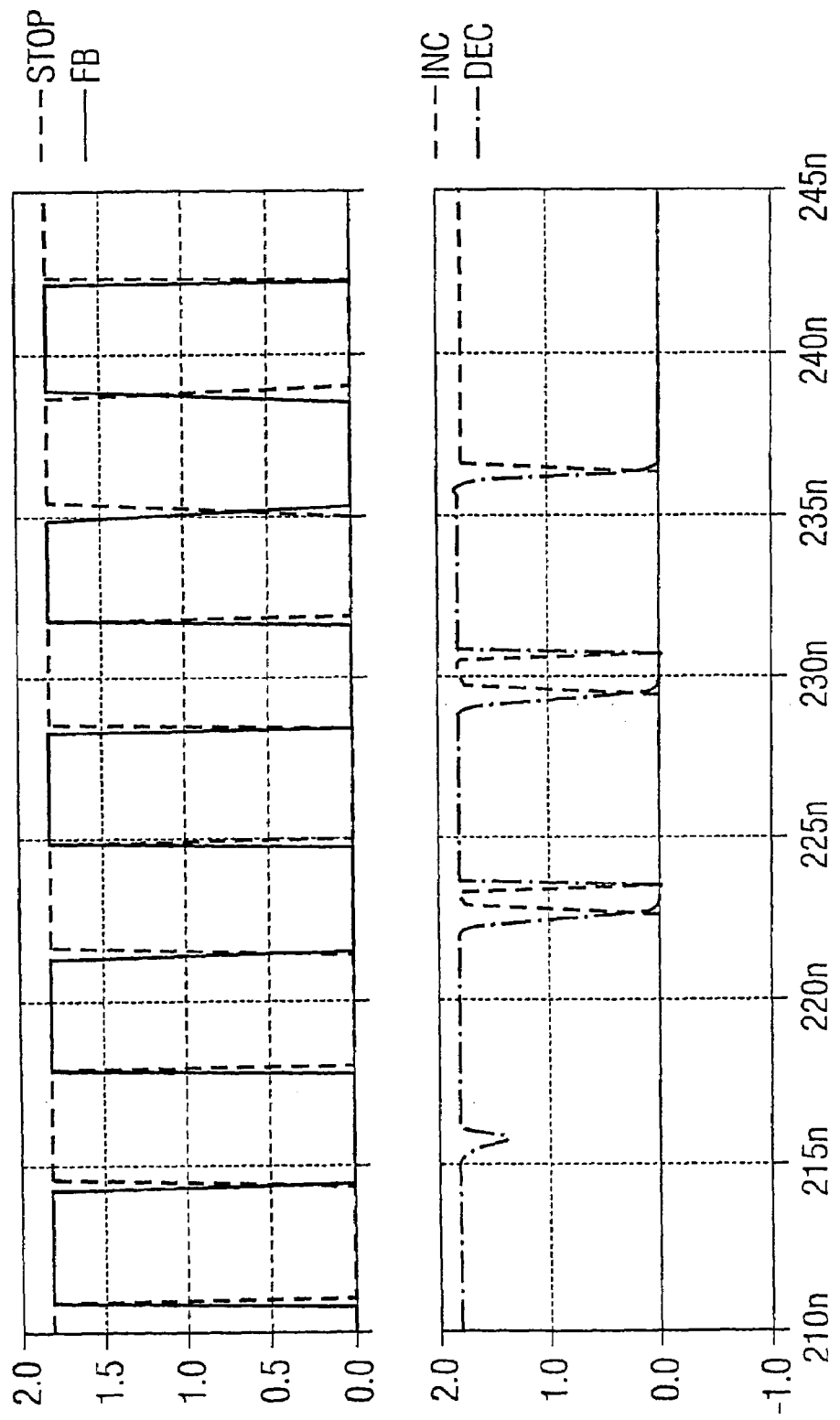
FIG. 5 is a first timing diagram with signal profiles of the delayed reference signal and feedback signal which lead to undesired, that is to say unstable, states of the incrementing signal and of the decrementing signal in the prior art phase detector.
Figure 6:
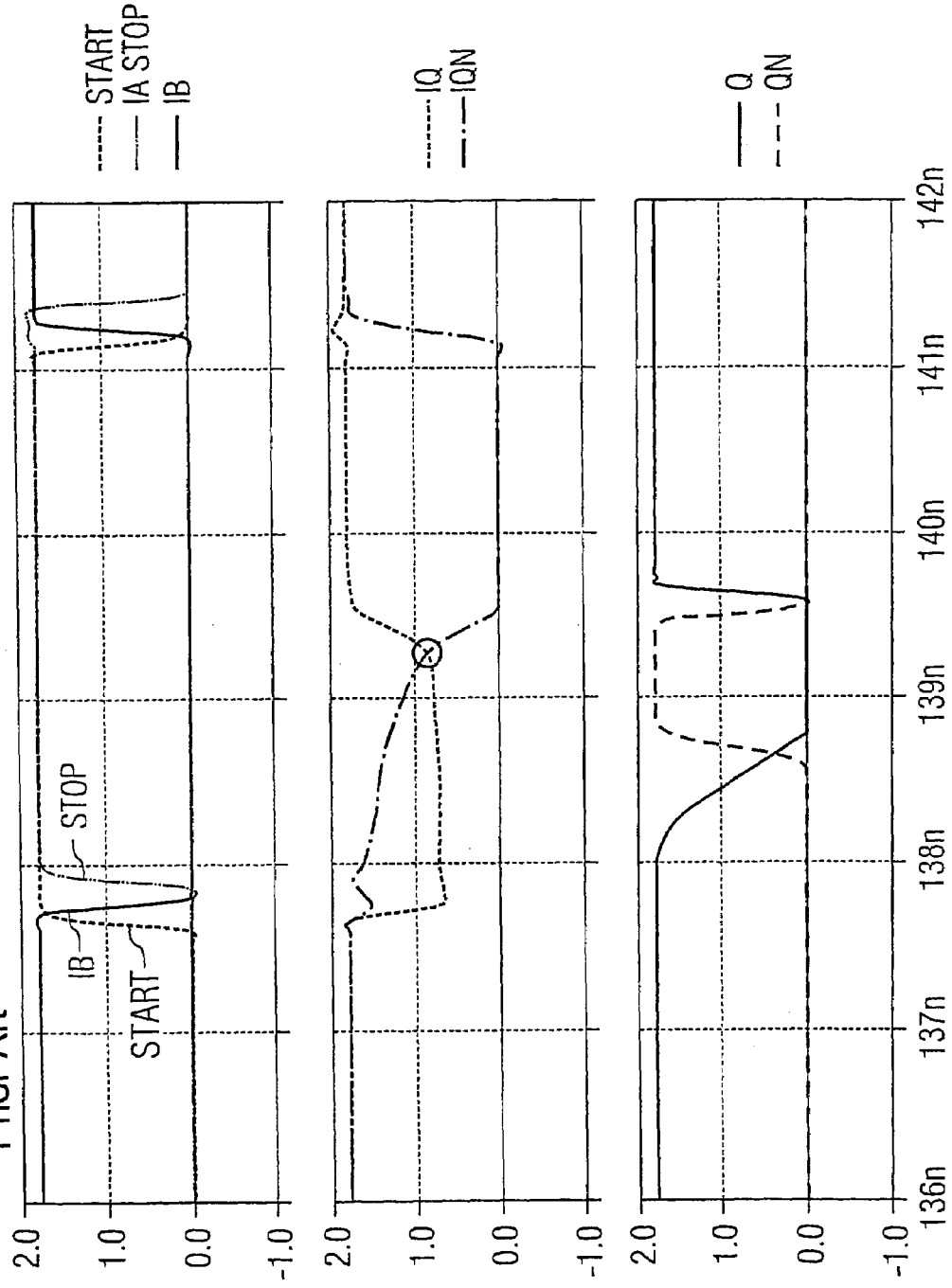
FIG. 6 is a second timing diagram with signal profiles of the delayed reference signal and feedback signal which lead to undesired, that is to say unstable, states of the incrementing signal and of the decrementing signal in the phase detector and thus to unstable states of the output signals of the prior art phase detector.
Figure 7:
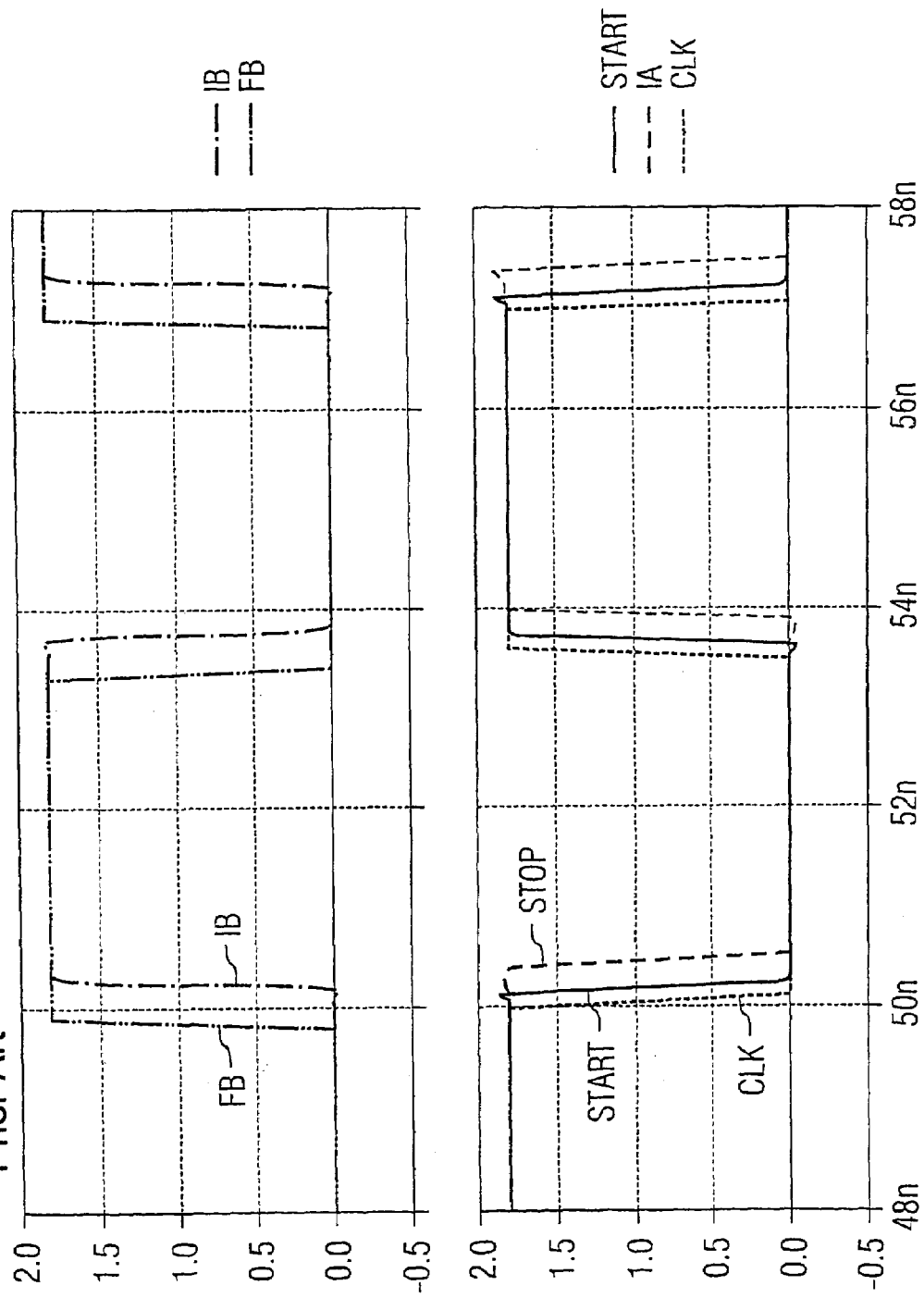
FIG. 7 is a third timing diagram with signal profiles of the undelayed and delayed feedback signal and also the signal profiles of the undelayed, slightly delayed and longer delayed reference signal of the prior art phase detector.
Figure 8:
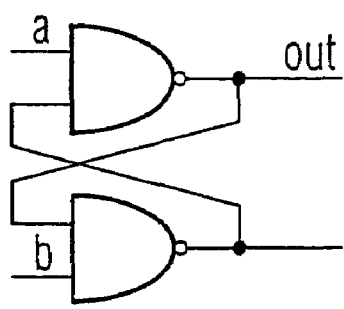
FIG. 8 is a diagram of a memory device which may be a component part of the phase detector according to the invention.
Figure 9:
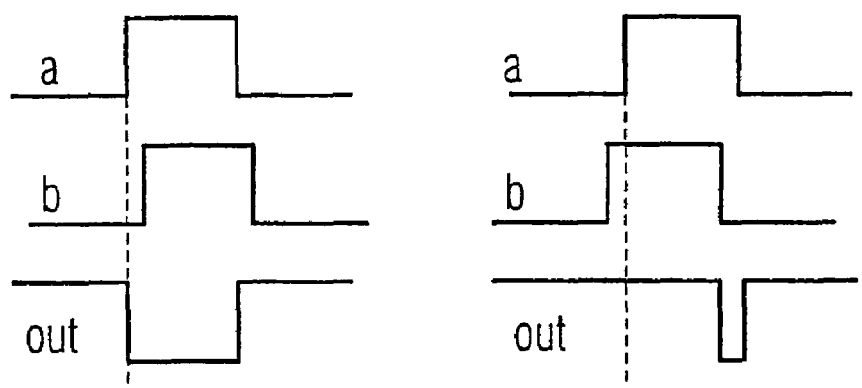
FIG. 9 is diagram illustrating input and output signal states which can be assumed by the memory device.

The RS flip-flop, as shown in FIG. 8, is constructed from two NAND gates which, on the output side, are fed back to one of the inputs of the respective other NAND gate. The signal at the two inputs a and b which changes first to the high state masks the output out of the flip-flop. That is to say that afterward a change in the second signal no longer has any significance for the state at the output out. Corresponding timing diagrams are shown in FIG. 9. The broken line identifies the instant from which a stable state is present. If the signal at the input a is the first to change to high, a subsequent change in the signal at the input b has no consequence for the state at the output out. The same applies if the signal at the input b is the first to change to high. If both signals at the inputs a and b of the flip-flop are at high, then the last state is stored. The stored signal and the inverted stored signal can be tapped off at the outputs of the RS flip-flop.

The reference signal clk and the feedback signal fb are present at the input of the phase detector according to the invention, illustrated in FIGS. 10 and 11. The reference signal clk passes through a plurality of series-connected inverters 2 and is delayed to a greater or lesser extent thereby. A slightly delayed reference signal STOP and a more greatly delayed reference signal en are thus formed. The slightly delayed reference signal STOP, which can be tapped off at the output of the second inverter 2, is present at the first input of the first RS flip-flop RS1. The feedback signal fb, which is likewise delayed by two series-connected inverters 2, is present as delayed feedback signal set_up at the second input of the RS flip-flop RS1. The output hgh of the first RS flip-flop RS1 is connected to the input of the third RS flip-flop RS3. The only slightly delayed reference signal STOP is additionally present at the first input of the second RS flip-flop RS2. The inverted delayed feedback signal set_low is present at the second input of the second RS flip-flop RS2. The output of the second RS flip-flop RS2, at which the signal lw can be tapped off, is connected to the second input of the third flip-flop RS3. The third flip-flop RS3 also has a third input, at which the more greatly delayed reference signal en is present. This signal en is generated by the reference signal clk being quadruply delayed by means of the series circuit of four inverters 2 serving as delay units.

The signals ev_inc and ev_dec at the outputs of the third flip-flop RS3 indicate by their logic states whether an increase or a reduction of the phase shift of the feedback signal fb with respect to the reference signal clk is necessary.

Finally, the incrementing signal INC and decrementing signal DEC can be tapped off at the outputs DA and DAN of the phase detector.

The further flip-flop RS4 connected downstream of the clock-state-controlled RS flip-flop RS3 generates a permanent signal level which changes only when the phase angle between the reference signal clk and the signal fb to be evaluated changes. The pulsed signals ev_inc and ev_dec thus become uniform signals. The further flip-flop RS4 is not absolutely necessary, however. It can be added or omitted as required.

In these exemplary embodiments, the flip-flops RS1, RS2, RS3 and RS4 are constructed from in each case two NAND gates which, on the output side, are fed back to one of the inputs of the respective other NAND gate.

The RS flip-flop RS5 serves for avoiding an offset and is used for symmetry reasons. Depending on the layout of the circuit, the flip-flop RS5 can also be dispensed with.

Ideally, fewer inverters 2 are necessary at the outputs DE and RE of the phase detector. The number of inverters 2 to be used depends on the desired delay between the slightly delayed and the more greatly delayed reference signal STOP and en, respectively, and the flip-flops RS1 and RS2, since the latter cause further delays of the signal propagation time. Therefore, the inverters 2 in part also serve for adapting the delay duration to the flip-flops RS1 and RS2.

In FIG. 11, as an alternative to FIG. 10, two inverters 2 are bridged by way of a bridge B in the signal path which carries and delays the reference signal clk. This is intended to illustrate that, as mentioned, the number of delay units is to be adapted to the technical requirements.

Figure 12:
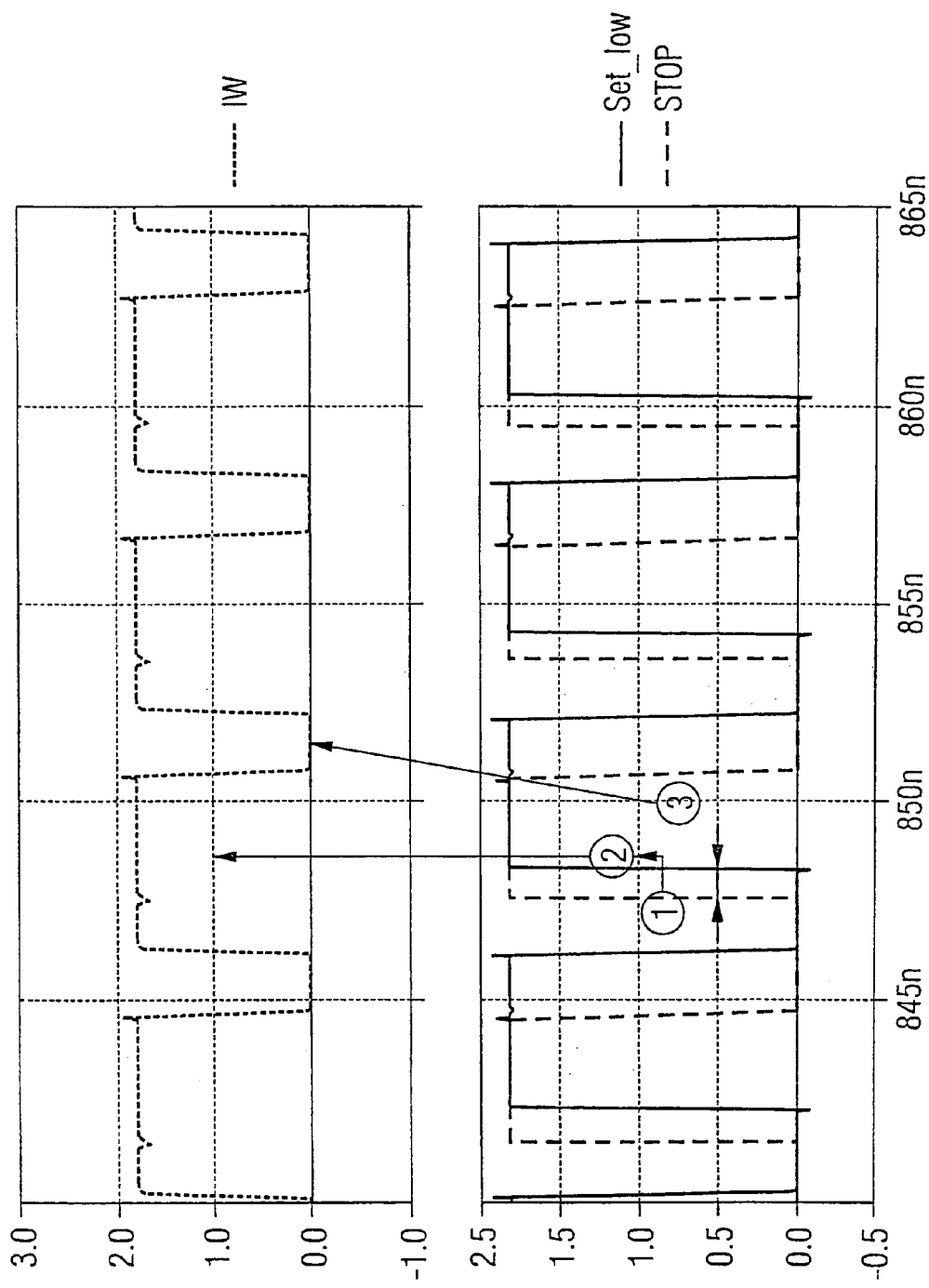
FIG. 12 is a first timing diagram of the phase detector according to the invention.

For further explanation of the method of operation of the phase detector according to the invention, FIG. 12 shows a timing diagram with the signal profiles of the flip-flop output signal lw, present at the output of the second flip-flop RS2, of the signal STOP, present at the first input of the second flip-flop RS2, and of the signal set_low, present at the input of the second flip-flop RS2. There is approximately 1 ns between two rising edges of the signals STOP and set_low. The state at the output of the second flip-flop RS2 cannot become low if the signal STOP changes to the high state first, that is to say before the signal level change of the signal set_low. Consequently, the rising edge of the signal STOP which occurs before the state change of the signal set_low blocks a state change at the flip-flop output.

Figure 13:
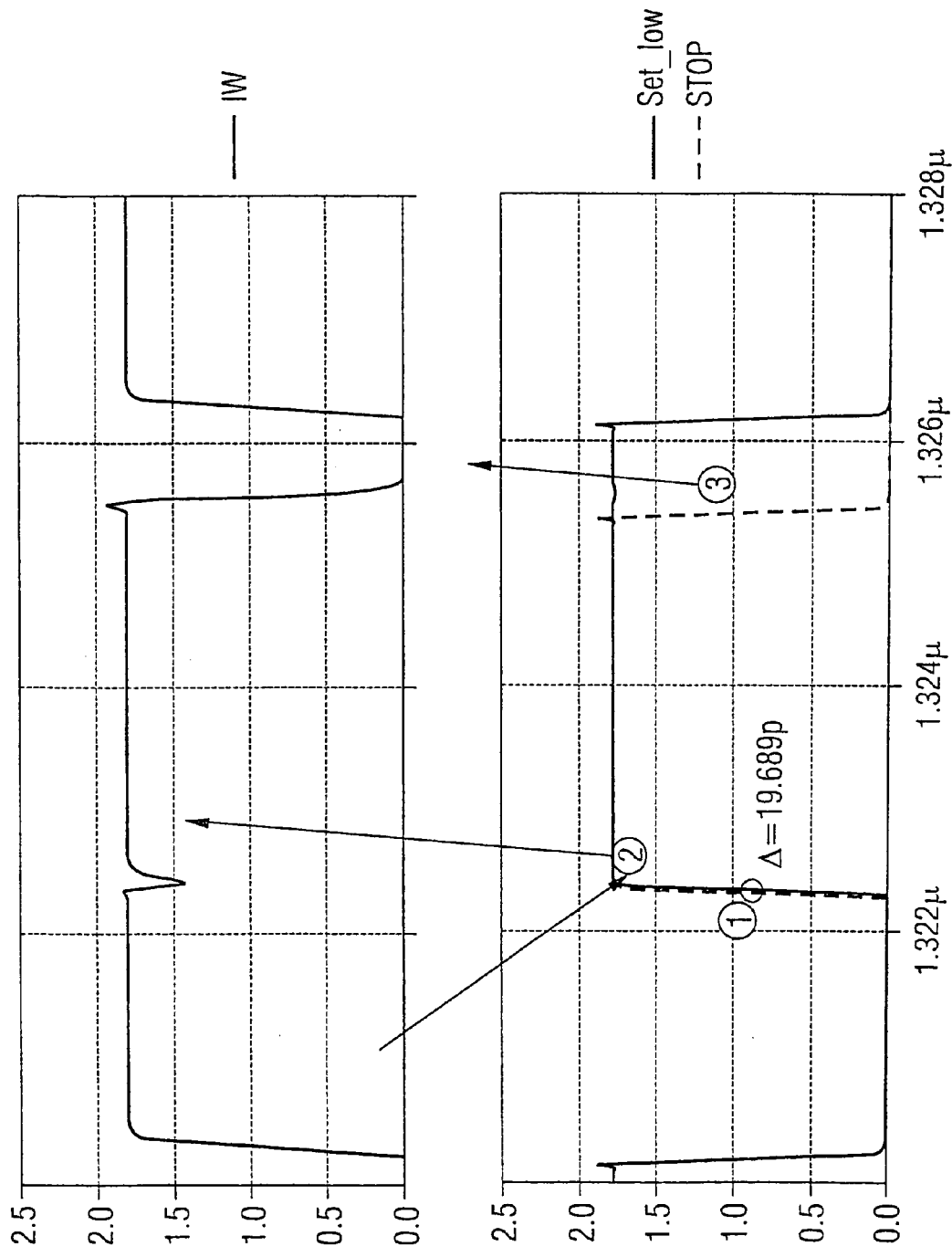
FIG. 13 is a second timing diagram of the phase detector according to the invention.

FIG. 13 shows a second timing diagram with signal profiles of the same signals lw, set_low and STOP of the phase detector according to the invention as have also already been shown in FIG. 12. However, the delay between the two signals set_low and STOP as shown in FIG. 13 is significantly shorter than the delay of the two signals as shown in FIG. 12 and is now only around 20 ps. It holds true in this case, too, that the state at the output of the second flip-flop RS2 cannot become low if the signal STOP changes to the high state first, that is to say before the signal level change of the signal set_low. Consequently, here, too, the rising edge of the signal STOP which occurs before the state change of the signal set_low blocks a state change at the flip-flop output.

Figure 14:
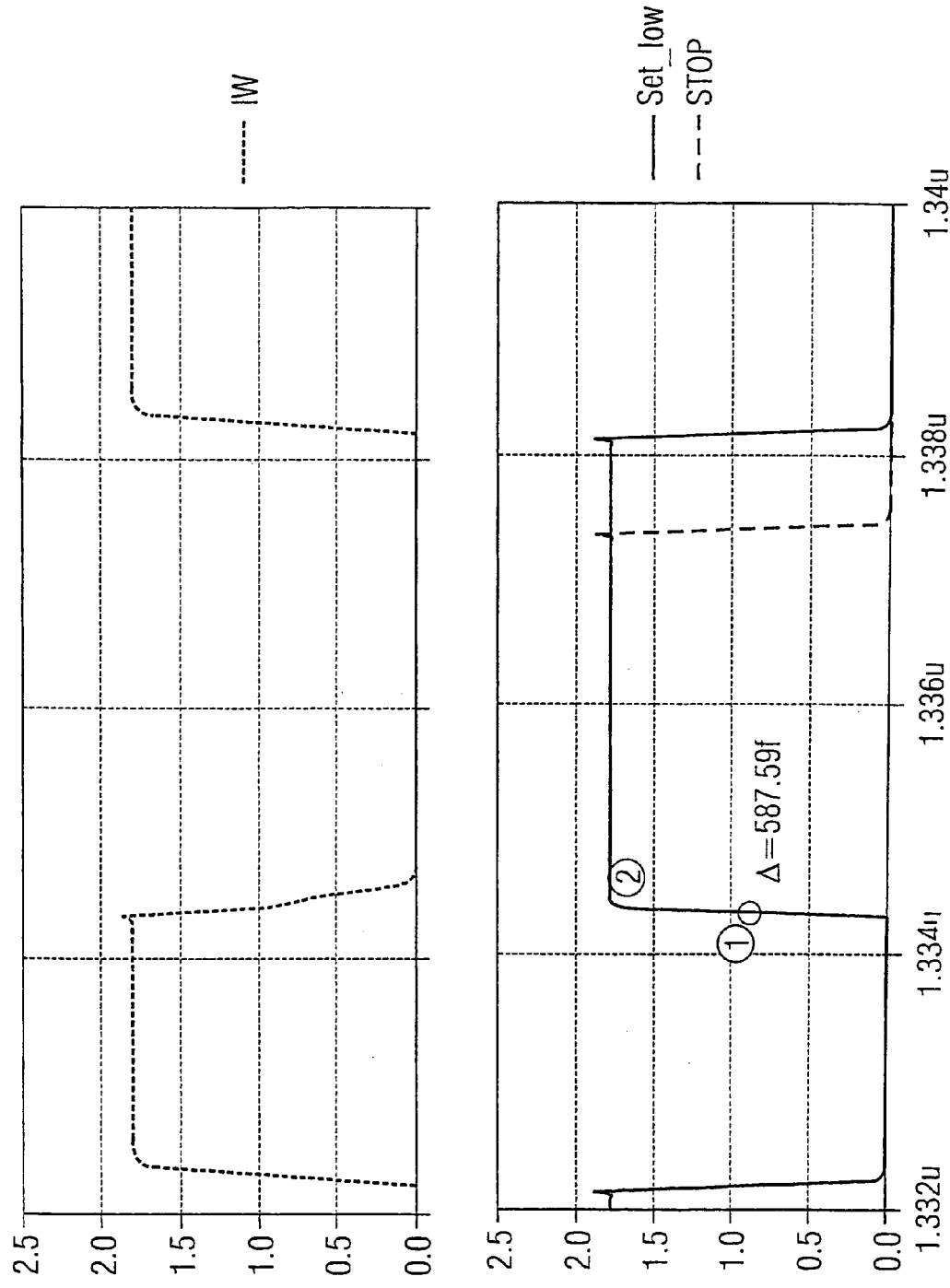
FIG. 14 is a third timing diagram of the phase detector according to the invention.

In the timing diagram illustrated in FIG. 14, the time interval between the two signals set_low and STOP has again been reduced further in comparison with the time interval shown in FIG. 13. Here it is only about 0.6 ps. The state at the output of the second flip-flop RS2 cannot become high if the signal set_low changes to the high state first, that is to say before the signal level change of the signal STOP. Consequently, the rising edge of the signal set_low which occurs before the state change of the signal STOP blocks a state change at the flip-flop output from low to high.

Figure 15:
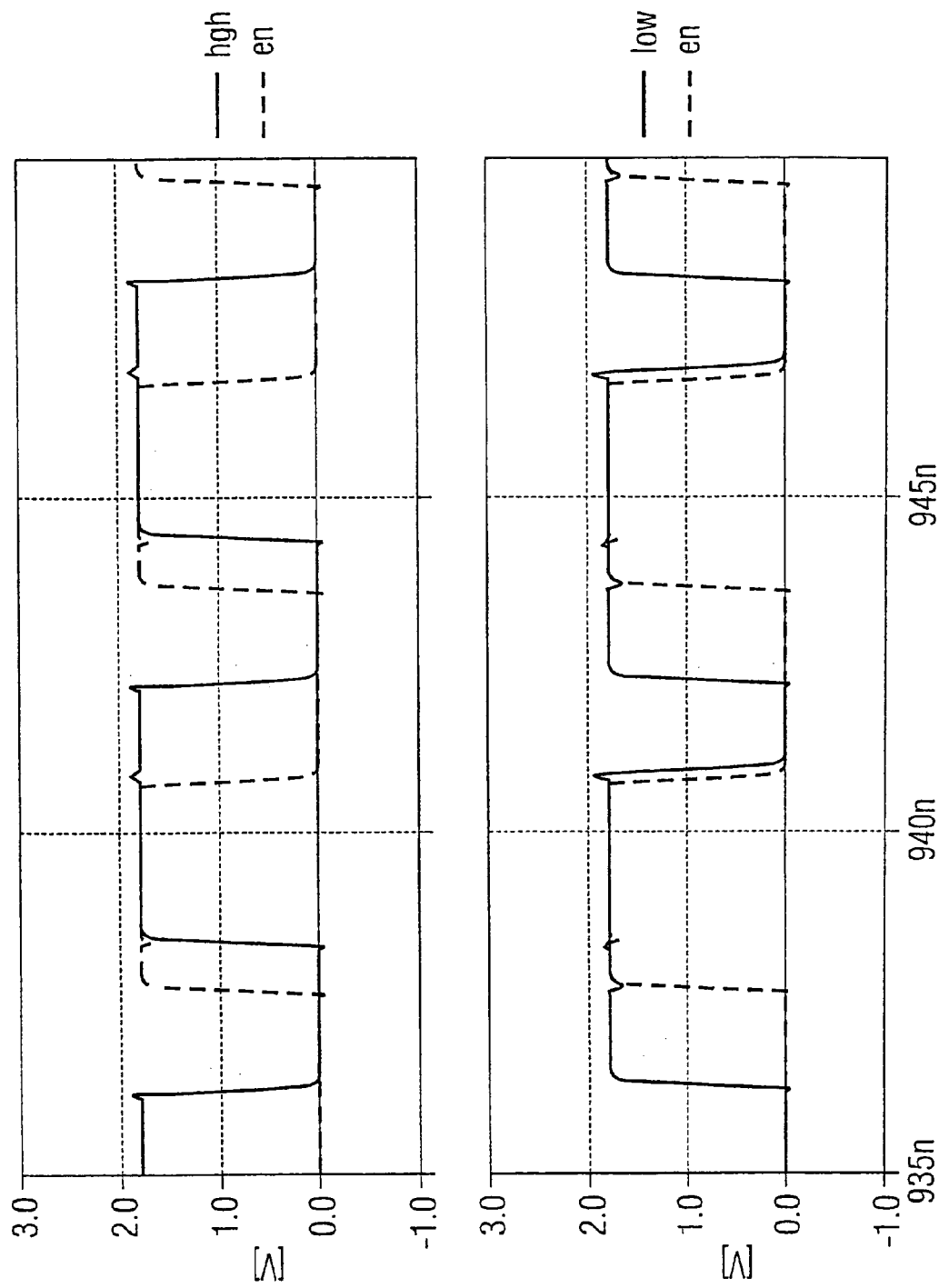
FIG. 15 is a fourth timing diagram of the phase detector according to the invention.

FIG. 15 shows a further timing diagram with signal profiles of the phase detector according to the invention. The illustration shows the profiles of the signals hgh and en in the upper region and the signals lw and en in the lower region. These three signals form the input signals of the clock-state-controlled RS flip-flop RS3. If the signal en is in the high state, the previous state is stored in the flip-flop RS3 and no state change other than that shown in FIG. 15 from high to low can take place. During the time duration in which the signal en is high, it is possible, since the state of the feedback signal is invariable as a result of the storage, for the phase angle to be evaluated without resulting in a metastable state at the output of the phase detector.

FIG. 16 shows, on the basis of a fifth timing diagram, the signal profiles for the signals ev_dec, ev_inc in the upper region and for the signals hgh, en and lw in the lower region. As long as the signal en is high, this means that either the signal lw or the signal hgh is in the low state or that both signals are in the high state. Either the signal ev_dec or the signal ev_inc then changes to the low state. The case where the incrementing signal ev_inc and the decrementing signal ev_dec assume an unstable state no longer occurs, however.

The timing diagrams shown in FIGS. 12 to 16 apply both to the exemplary embodiment of the phase detector according to the invention shown in FIG. 10 and to that shown in FIG. 11.

We claim:

1. A phase detector, comprising:
    a reference signal input for receiving a reference signal and a detector input for receiving a signal to be evaluated;
    a memory unit connected to said detector input for storing a state of the signal to be evaluated at a storage instant, said memory unit having a first memory device and a second memory device;
    said first memory device having a first input for receiving and storing the signal to be evaluated;
    said second memory device having a first input for receiving and storing an inverted version of the signal to be evaluated;
    each of said first and second memory devices having a second input for receiving a signal prescribing the storage instant;
    an evaluation unit connected downstream of said memory unit, in a signal flow direction, and adapted to compare the stored state of the signal to be evaluated and the stored state of the inverted signal to be evaluated at an evaluation instant according to the reference signal to generate an evaluation result signal therefrom;
    a control unit for prescribing the storage instant and the evaluation instant, said control unit being connected to said memory unit and to said evaluation unit and configured to first prescribe the storage instant and subsequently prescribe the evaluation instant; and
    an output connected to said evaluation unit and carrying the evaluation result signal.

2. The phase detector according to claim 1, wherein each of said first and second memory devices has a flip-flop for storage purposes.

3. The phase detector according to claim 1, wherein:
    each of said first and second memory devices has two NAND gates; and
    for each memory device, each of said NAND gates has gate inputs and a gate output, and each said NAND gate output is connected back to one of said gate inputs of the respective other NAND gate.

4. The phase detector according to claim 1, wherein said memory unit is configured to be operated for storing the state of the signal to be evaluated in an event of a rising edge of a signal prescribing the storage instant.

5. The phase detector according to claim 1, wherein said evaluation unit comprises a clock-state-controlled RS flip-flop.

6. The phase detector according to claim 5, wherein said clock-state-controlled RS flip-flop has two flip-flop inputs connected to outputs of the first memory device and the second memory device.

7. The phase detector according to claim 5, wherein said detector comprises a flip-flop connected downstream of said clock-state-controlled RS flip-flop.

8. The phase detector according to claim 5, wherein:
said control unit is configured to generate a delayed signal for defining the evaluation instant; and
said clock-state-controlled RS flip-flop has an input for clock state control, and said input is connected to receive the delayed signal.

9. The phase detector according to claim 1, which comprises a further flip-flop having an input connected to the outputs of said memory unit and configured to suppress an offset.

10. The phase detector according to claim 1, wherein said control unit has inverters for generating a signal delay.

* * * * *